(12) United States Patent
Kamiura et al.

(10) Patent No.: US 6,544,904 B1
(45) Date of Patent: Apr. 8, 2003

(54) METHOD OF MANUFACTURING SEMICONDUCTOR DEVICE

(75) Inventors: Yuuki Kamiura, Hyogo (JP); Hiroshi Tobimatsu, Tokyo (JP); Kouji Oda, Tokyo (JP); Mahito Sawada, Tokyo (JP); Koji Shibata, Tokyo (JP); Hiroyuki Kawata, Tokyo (JP)

(73) Assignees: Ryoden Semiconductor System Engineering Corporation, Itami (JP); Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/157,882

(22) Filed: May 31, 2002

(30) Foreign Application Priority Data

Dec. 17, 2001 (JP) .......................... 2001-382940

(51) Int. Cl.⁷ .................... H01L 21/31; H01L 21/469
(52) U.S. Cl. .................... 438/781; 438/780; 438/706; 438/725
(58) Field of Search ..................... 438/781, 780, 438/706, 712, 725; 430/317, 319, 330; 427/96

(56) References Cited

U.S. PATENT DOCUMENTS

| | | | |
|---|---|---|---|
| 4,523,976 A | * 6/1985 | Bukhman et al. | 156/643 |
| 4,560,436 A | * 12/1985 | Bukhman et al. | 156/643 |
| 5,242,864 A | * 9/1993 | Fassberg et al. | 437/228 |
| 5,869,219 A | * 2/1999 | Kuo et al. | 430/270.1 |
| 5,955,245 A | * 9/1999 | Choi | 430/326 |
| 6,127,099 A | * 10/2000 | Shinohara | 430/317 |

FOREIGN PATENT DOCUMENTS

JP          9-306901        11/1997

\* cited by examiner

Primary Examiner—Alexander Ghyka
(74) Attorney, Agent, or Firm—Oblon, Spivak, McClelland, Maier & Neustadt, P.C.

(57) ABSTRACT

A method of manufacturing a semiconductor device is provided, which prevents a polyimide film from coming unstuck from a film to be subjected to isotropic etching, and further prevents deposits adhered to respective side faces of the films from coming off, during a heat treatment for imidizing the polyimide film. Isotropic etching is performed on a silicon nitride film 4 using, as a mask, a polyimide film 5 having a predetermined pattern formed therein. Next, a heat treatment is carried out to imidize the polyimide film 5 prior to performing anisotropic etching on a silicon oxide film 3. During the heat treatment for imidizing the polyimide film 5, since deposits, which are to be generated by anisotropic etching, are not yet adhered to the respective side faces of the films, the polyimide film 5 does not come unstuck from the silicon nitride film 4. Further, the deposits which are adhered to the respective side face of the films after the heat treatment will not come off.

9 Claims, 6 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device in which a film to be subjected to anisotropic etching, another film to be subjected to isotropic etching, and a polyimide film are sequentially deposited in that order.

2. Description of the Background Art

FIGS. 13–18 are sectional views of structures at respective steps of a conventional method of manufacturing a semiconductor device. As illustrated in FIG. 13, a passivation film 160 comprising a silicon oxide film 130 and a silicon nitride film 140 is formed over a semiconductor substrate 110 on which a wiring process and other process (es) typically included prior to the wiring process in a semiconductor manufacturing operation have been performed. More specifically, the silicon oxide film 130 is formed over the semiconductor substrate 110 so as to cover an interconnect 120 formed on the semiconductor substrate 110, and subsequently, the silicon nitride film 140 is formed on the silicon oxide film 130. Next, a polyimide film 150 functioning as both a buffer layer and a coating layer is formed on the passivation film 160, to be more exact, on the silicon nitride film 140, as illustrated in FIG. 14. Turning to FIG. 15, then, a predetermined pattern is formed in the polyimide film 150 by a photolithograpy process. For the formation of the predetermined pattern in the polyimide film 150, when the polyimide film 150 is not photosensitive in nature, a photoresist (not shown) is applied to the polyimide film 150, and exposure and development are performed on the applied photoresist, to form a resist pattern. By etching the polyimide film 150 using the resist pattern of the photoresist, the predetermined pattern is formed in the polyimide film 150. Additionally, the photoresist is removed after the formation of the predetermined pattern in the polyimide film 150. On the other hand, when the polyimide film 150 is photosensitive in nature, it is unnecessary to use a photoresist. In such case, it is possible to form the predetermined pattern in the polyimide film 150 by performing exposure and development directly on the polyimide film 150.

Next, the passivation film 160 is etched using the patterned polyimide film 150 as a mask, to expose the interconnect 120. More specifically, first, isotropic etching is performed on the silicon nitride film 140 using the patterned polyimide film 150 as a mask, to selectively remove the silicon nitride film 140 as illustrated in FIG. 16. For the isotropic etching performed at that time, reactive ion etching may be employed, for example. Subsequently, referring to FIG. 17, anisotropic etching is performed on the silicon oxide film 130 using again the patterned polyimide film 150 as a mask while employing reactive ion etching, for example, to expose a portion of the interconnect 120. Then, referring to FIG. 18, a heat treatment is carried out at a temperature in the range of approximately 300 to 450° C. The heat treatment is intended to imidize the polyimide film 150 and evaporate a solvent used in the polyimide film 150. Further, in the case where the polyimide film 150 is photosensitive, the heat treatment is effective also in evaporating a photosensitizer in the polyimide film 150. While not shown, a wire bonding process follows, so that the exposed portion of the interconnect 120 and an external terminal (not shown) are connected to each other via an aluminum wire or the like.

Having described the overall sequence of the conventional method, attention is now brought to the step illustrated in FIG. 18, where the heat treatment is performed. It is noted that the heat treatment at this step causes not only the imidization of the polyimide film 150 but also shrinkage of the polyimide film 150. After the heat treatment, the volume of the polyimide film 150 is reduced by about 50% and the polyimide film 150 has a sloped side face. For this reason, if the heat treatment to imidize the polyimide film 150 is carried out prior to etching the passivation film 160, to be more exact, prior to the isotropic etching on the silicon nitride film 140 illustrated in FIG. 16, and the passivation film 160 is etched using the imidized polyimide film 150 as a mask, it would probably result in failure to achieve a desired dimensional accuracy of the etched passivation film 160. However, according to the conventional method of manufacturing a semiconductor device as described above, the polyimide film 150 is imidized by carrying out the heat treatment after the passivation film 160 is etched to expose the interconnect 120. Accordingly, the volume shrinkage of the polyimide film 150 does not occur before etching the passivation film 160. This allows for increase in the dimensional accuracy of the etched passivation film 160.

Nevertheless, the conventional method has drawbacks. Specifically, referring to FIG. 17, deposits 180 are adhered to side faces of the polyimide film 150, the silicon nitride film 140 and the silicon oxide film 130 during the anisotropic etching on the silicon oxide film 130. As the heat treatment for imidizing the polyimide film 150 is carried out after the anisotropic etching in the conventional method, there has been likely arisen a problem such that the deposits 180 come off, or the polyimide film 150 comes unstuck from the silicon nitride film 140 as illustrated in FIG. 18. In particular, dry etching such as reactive ion etching is mostly employed for the anisotropic etching on the silicon oxide film 130. In such case, the etching is carried out while adhering the deposits 180 which have a high resistance to etching to the side face of the silicon oxide film 130, in order to achieve a required etch anisotropy for the anisotropic etching on the silicon oxide film 130. However, during the etching, the deposits 180 are also adhered to the side faces of the polyimide film 150 and the silicon nitride film 140 as mentioned above. To carry out the heat treatment for imidizing the polyimide film 150 with the deposits 180 being adhered to the respective side faces of the polyimide film 150 and the silicon nitride film 140 as well as the side face of the silicon oxide film 130 would probably cause the deposits 180 to come off due to the volume shrinkage of the polyimide film 150 and a thermal stress. Further, the deposits 180 do not shrink substantially during the heat treatment for the imidization of the polyimide film 150 during which the polyimide film 150 is shrinking. Accordingly, the volume shrinkage of the polyimide film 150 is limited by the deposits 180 on the polyimide film 150, so that the polyimide film 150 can not completely shrink. As a result, a force that the polyimide film 150 has failed to exert for the shrinkage thereof due to the limitation imposed by the deposits 180, in other words, a force that is saved as a result of the incomplete shrinkage of the polyimide film 150, is applied to an interface between the polyimide film 150 and the silicon nitride film 140. Because of this, conventionally, it has been likely that the polyimide film 150 comes unstuck from the silicon nitride film 140.

SUMMARY OF THE INVENTION

It is therefore an object of the present invention to provide a method of manufacturing a semiconductor device in which a film to be subjected to anisotropic etching, another film to be subjected to isotropic etching and a polyimide film are sequentially deposited in that order, which method prevents the polyimide film from coming unstuck from the film to be subjected to isotropic etching, as well as prevents deposits adhered to the respective side faces of the deposited films because of the anisotropic etching from coming off, during a heat treatment for imidizing the polyimide film.

According to the present invention, the method of manufacturing a semiconductor device includes the following steps (a) to (e). The step (a) is to form a polyimide film over a first film with a second film interposed therebetween. The step (b) is to form a predetermined pattern in the polyimide film after the step (a). The step (c) is to perform isotropic etching on the second film using the polyimide film as a mask after the step (b), to expose the first film. The step (d) is to imidize the polyimide film by carrying out a heat treatment after the step (c). The step (e) is to perform anisotropic etching on an exposed portion of the first film after the step (d).

The step (d) is carried out prior to the step (e), so that no deposit is adhered to the side faces of the polyimide film and the second film during the heat treatment for imidizing the polyimide film. In view of this, it is possible to prevent the polyimide film from coming unstuck from the second film during the heat treatment for imidizing the polyimide film.

Further, as the anisotropic etching in the step (e) is performed on the first film after the heat treatment for imidizing the polyimide film in the step (d), the deposits are generated and adhered to the respective side faces of the first and second films and the polyimide film by the anisotropic etching after the heat treatment for imidizing the polyimide film. In view of this, it is possible to prevent the deposits adhered to the respective side faces of the deposited films by the anisotropic etching from coming off.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
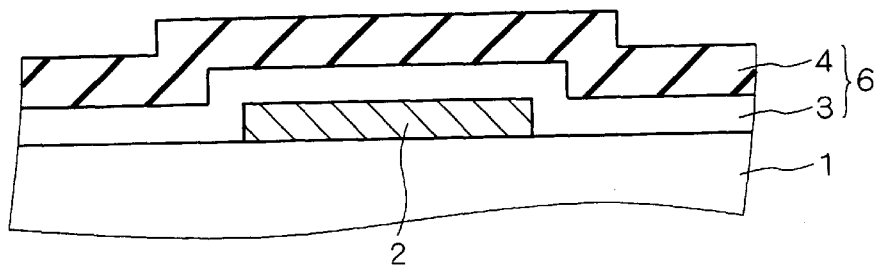
FIGS. 1 through 6 are sectional views of structures at respective steps of a method of manufacturing a semiconductor device according to a first preferred embodiment of the present invention.
Figure 2:
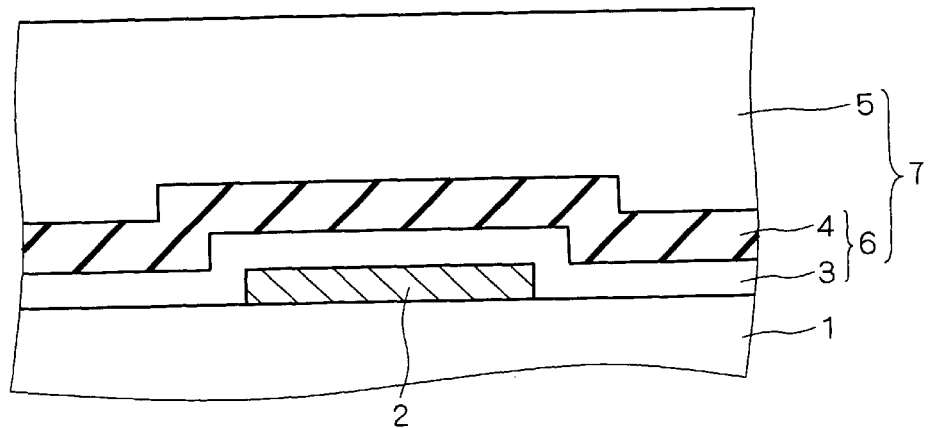

FIGS. 1–6 are sectional views of structures at respective steps of a method of manufacturing a semiconductor device according to a first preferred embodiment of the present invention, for illustrating the method. Out of those drawings, FIGS. 3–6 illustrate steps of forming a predetermined pattern in a passivation film 7, details of which will be described later. First, referring to FIG. 1, a passivation film 6 having a bilayer structure comprising a silicon oxide film 3 and a silicon nitride film 4 is formed over a semiconductor substrate 1 on which a wiring process and other process(es) typically included prior to the wiring process in a semiconductor manufacturing operation have been performed. More specifically, the silicon oxide film 3 is formed over the semiconductor substrate 1 so as to cover an interconnect 2 of for example, aluminum and is formed on the semiconductor substrate 1. Subsequently, the silicon nitride film 4 is formed on the silicon oxide film 3. Next, a polyimide film 5 functioning as both a buffering layer and a coating layer is formed on the passivation film 6, to be more exact, on the silicon nitride film 4 as shown in FIG. 2. The polyimide film 5 functions as a buffer layer and a coating layer, which means protecting, together with the passivation film 6, the surface of the semiconductor device to be manufactured. In this connection, a combination of the polyimide film 5 and the passivation film 6 will be referred to as a "passivation film 7" in the instant description. In other words, the silicon oxide film 3, the silicon nitride film 4 and the polyimide film 5 form the passivation film 7. Furthermore, the polyimide film 5 as initially formed in the step illustrated in FIG. 2 is a varnish-like substance which is in the form of liquid with high viscosity.

Figure 3:
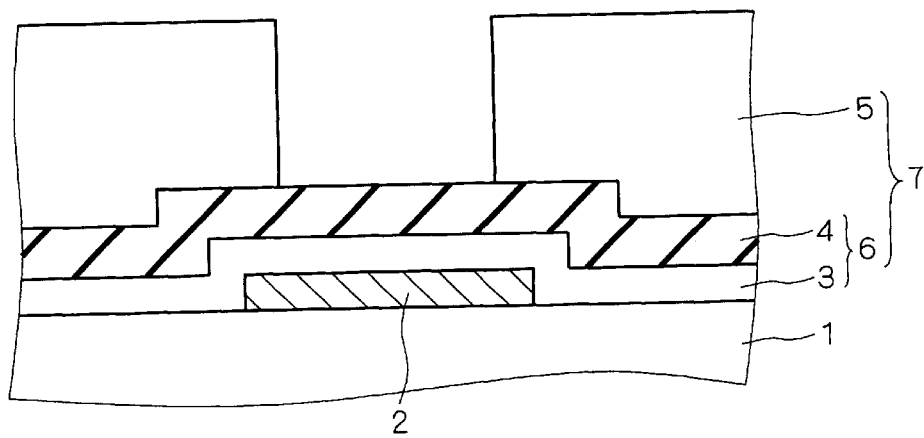

Then, the predetermined pattern is formed in the passivation film 7 comprising the silicon oxide film 3, the silicon nitride film 4 and the polyimide film 5. More specifically, first, a predetermined pattern is formed in the polyimide film 5 by a photolithography process as illustrated in FIG. 3. The step of FIG. 3 will be explained in more detail below. When the polyimide film 5 is not photosensitive in nature, a photoresist (not shown) is applied to the polyimide film 5, and exposure and development are performed on the applied photoresist, to form a resist pattern. By etching the polyimide film 5 using the resist pattern of the photoresist as a mask, the predetermined pattern is formed in the polyimide film 5. Thereafter, the photoresist is removed. On the other hand, when the polyimide film 5 is photosensitive in nature, it is unnecessary to use a photoresist. In such case, exposure and development are performed directly on the polyimide film 5, to form the predetermined pattern in the polyimide film 5. After the formation of the predetermined pattern in the polyimide film 5, ashing is performed with oxygen plasma.

Figure 4:
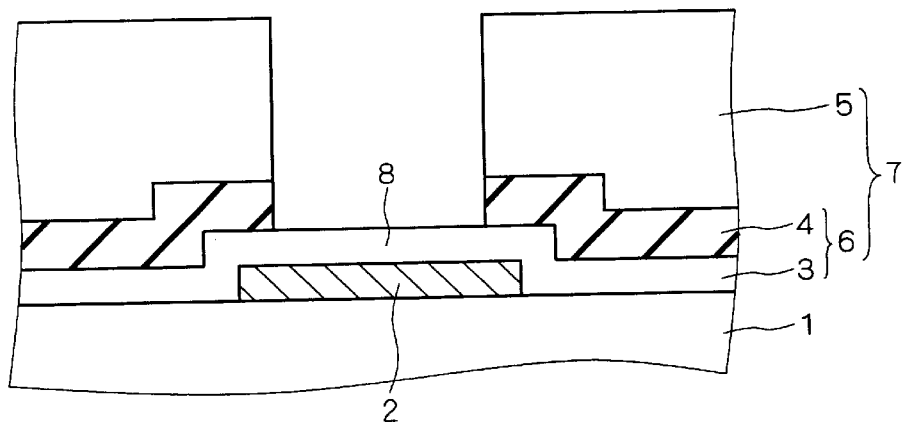
Figure 5:
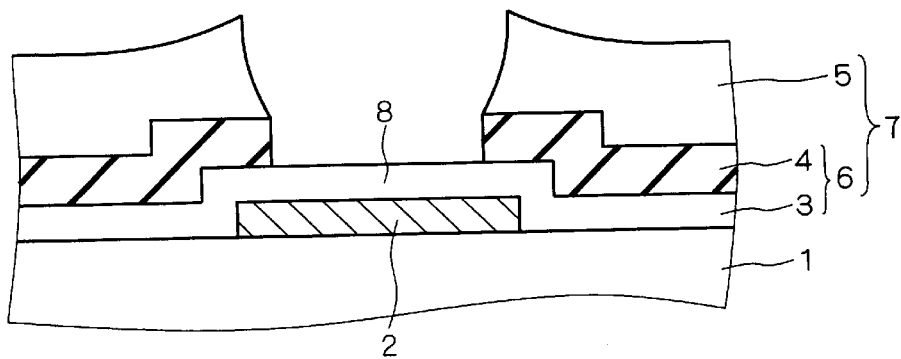

Referring to FIG. 4, isotropic etching is performed on the silicon nitride film 4 using the patterned polyimide film 5 as a mask. As a result of this etching, the silicon nitride film 4 is selectively removed, so that the silicon oxide film 3 is partially exposed. For the isotropic etching at that time, dry etching is employed. For example, reactive ion etching may be performed. After the silicon nitride film 4 is selectively removed by the isotropic etching, ashing is performed with oxygen plasma. Turning to FIG. 5, then, a heat treatment is carried out at a temperature in the range of approximately 300 to 450° C., to imidize the polyimide film 5. It is noted that the heat treatment is intended to evaporate a solvent used in the polyimide film 5, as well as to imidize the polyimide film 5. Further, in the case where the polyimide film 5 is photosensitive, the heat treatment at that time is also effective in evaporating a photosensitizer in the polyimide film 5.

Figure 6:
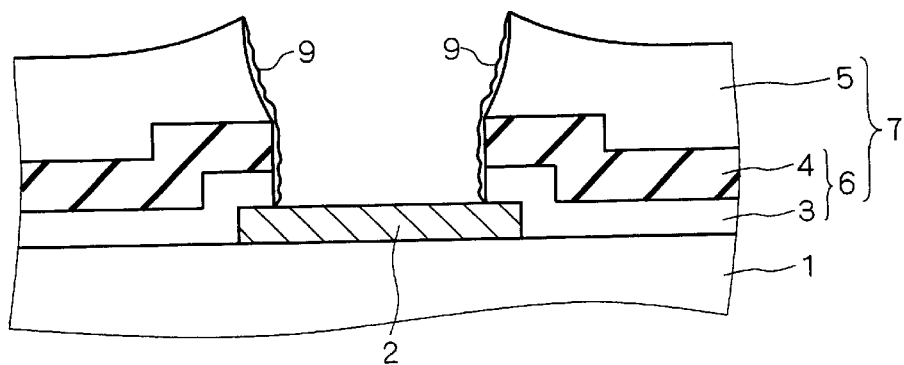

Subsequently, referring to FIG. 6, anisotropic etching is performed on a portion 8 of the silicon oxide film 3 which has been exposed by the step illustrated in FIG. 5. More specifically, according to the first preferred embodiment, anisotropic etching is performed on the silicon oxide film 3 using, as a mask, the silicon nitride film 4 which has undergone the isotropic etching. As a result of the anisotropic etching, the silicon oxide film 3 is selectively removed and a portion of the interconnect 2 is exposed. For the anisotropic etching at that time, dry etching is employed. For example, reactive ion etching may be performed. Accordingly, deposits 9 are adhered to side faces of the silicon oxide film 3, the silicon nitride film 4 and the polyimide film 5 as illustrated in FIG. 6. After the silicon oxide film 3 is partially removed by the anisotropic etching, ashing is performed with oxygen plasma, thereby to complete the predetermined pattern in the passivation film 7. While not shown, a wire-bonding process follows, so that the exposed portion of the interconnect 2 and an external terminal (not shown) are connected to each other via an aluminum wire or the like.

A process order of the method of manufacturing a semiconductor device according to the first preferred embodiment as described above includes; first, the isotropic etching on the silicon nitride film 4 illustrated in FIG. 4; next, the heat treatment to imidize the polyimide film 5 illustrated in FIG. 5; and then, the anisotropic etching on the silicon oxide film 3 illustrated in FIG. 6. In applying the method to a semiconductor device with the passivation film 7 comprising the silicon oxide film 3, the silicon nitride film 4 and the polyimide film 5, the foregoing process order allows the heat treatment for imidizing the polyimide film 5 to be carried out with the deposits 9, which are to be usually generated by anisotropic dry etching, not yet being adhered to the side faces of the silicon nitride film 4 and the polyimide film 5. Thus, not suffering from the above-noted problems associated with the conventional method, the method according to the first preferred embodiment makes it possible to imidize the polyimide film 5 while keeping the polyimide film 5 stuck to the silicon nitride film 4. In other words, it is possible to prevent the polyimide film 5 from coming unstuck from the silicon nitride film 4 to be subjected to the isotropic etching, during the heat treatment for imidizing the polyimide film 5.

The foregoing process order of the method according to the first preferred embodiment produces a further advantage in that the anisotropic etching on the silicon oxide film 3 is performed after the heat treatment for imidizing the polyimide film 5. Specifically, the deposits 9 are generated and adhered to the respective side faces of the silicon oxide film 3, the silicon nitride film 4 and the polyimide film 5 by the anisotropic etching on the silicon oxide film 3 after the heat treatment for imidizing the polyimide film 5. Hence, advantageously over the conventional method, there is no likelihood that the deposits 9 come off. Thus, it is possible to prevent the deposits 9 which are adhered to the respective side faces of the deposited films by the anisotropic etching from coming off.

Moreover, as the polyimide film 5 is imidized by the heat treatment prior to the etching of the silicon oxide film 3, the volume shrinkage of the polyimide film 5 occurs and the polyimide film 5 has a sloped side face before the etching of the silicon oxide film 3. The sloped side face of the polyimide film 5, however, does not adversely affects the etching on the silicon oxide film 3, because not the polyimide film 5 but the silicon nitride film 4 is used as a mask in etching the silicon oxide film 3 in the first preferred embodiment. Thus, the method according to the first preferred embodiment is not inferior to the conventional method with respect to the dimensional accuracy of the etched silicon oxide film 3.

Second Preferred Embodiment

Figure 7:
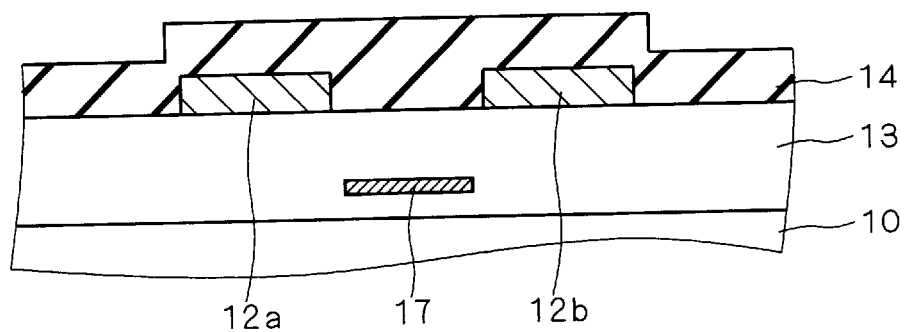
FIGS. 7 through 12 are sectional views of structures at respective steps of a method of manufacturing a semiconductor device according to a second preferred embodiment.

FIGS. 7–12 are sectional views of structures as respective steps of a method of manufacturing a semiconductor device according to a second preferred embodiment of the present invention, for illustrating the method. First, referring to FIG. 7, a passivation film 14 with a single layer structure comprising a silicon nitride film is formed over a semiconductor substrate 10 on which a wiring process and other process(es) typically included prior to the wiring process in a semiconductor manufacturing operation have been performed. More specifically, an interlayer insulating film 13 comprising a silicon oxide film is formed on the semiconductor substrate 10. Next, interconnects 12a, 12b of aluminum, for example, are formed on the interlayer insulating film 13, spaced from each other by a predetermined distance. Then, the passivation film 14 is formed over the interlayer insulating film 13 so as to cover the interconnects 12a, 12b. Further, a fuse 17 of aluminum, for example, is formed within the interlayer insulating film 13 as illustrated in FIG. 7.

Figure 8:
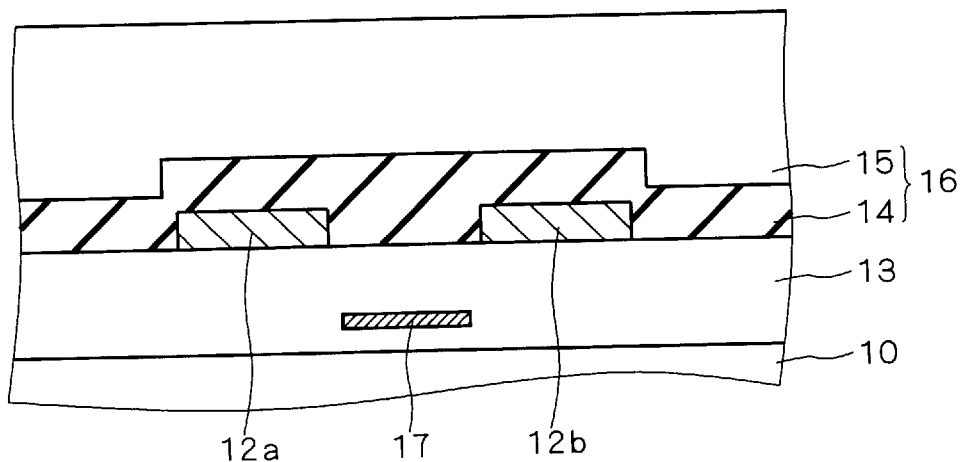

Turning to FIG. 8, a polyimide film 15 functioning as both a buffer layer and a coating layer is formed on the passivation film 14. The polyimide film 15 functions as a buffer layer and a coating layer, which means protecting, together with the passivation film 14, the surface of the semiconductor device to be manufactured. In this connection, a combination of the polyimide film 15 and the passivation film 14 will be referred to as a "passivation film 16" in the instant description. In other words, the passivation film 14 comprising the silicon nitride film and the polyimide film 15 form the passivation film 16. Furthermore, the polyimide film 15 as initially formed in the step illustrated in FIG. 8 is a varnish-like substance which is in the form of liquid with high viscosity.

Figure 9:
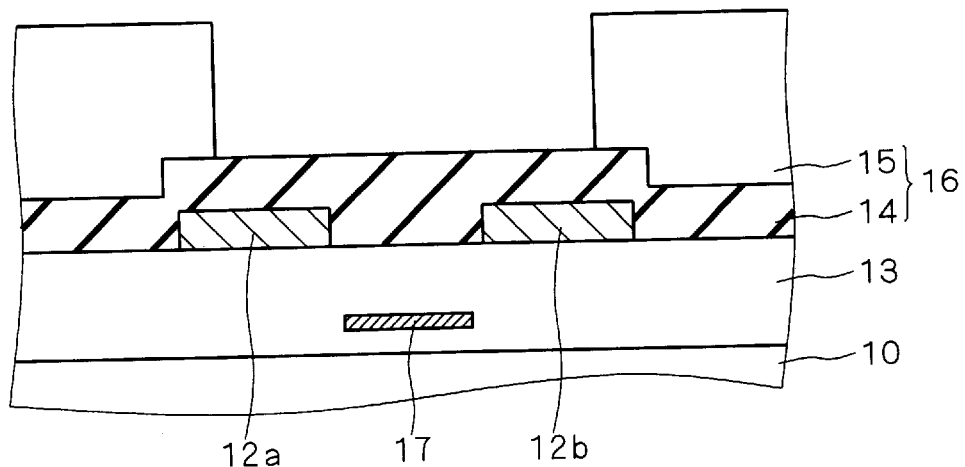

Then, a predetermined pattern is formed in the passivation film 16. More specifically, first, a predetermined pattern is formed in the polyimide film 15 by a photolithography process as illustrated in FIG. 9. The step of FIG. 9 will be explained in more detail below. When the polyimide film 15 is not photosensitive in nature, a photoresist (not shown) is applied to the polyimide film 15, and exposure and development are performed on the applied photoresist, to form a resist pattern. By etching the polyimide film 15 using the resist pattern of the photoresist as a mask, the predetermined pattern is formed in the polyimide film 15. Thereafter, the photoresist is removed. On the other hand, when the polyimide film 15 is photosensitive in nature, it is unnecessary to use a photoresist. In such case, exposure and development are performed directly on the polyimide film 15, to form the predetermined pattern in the polyimide film 15. After the formation of the predetermined pattern in the polyimide film 15, ashing is performed with oxygen plasma.

Figure 10:
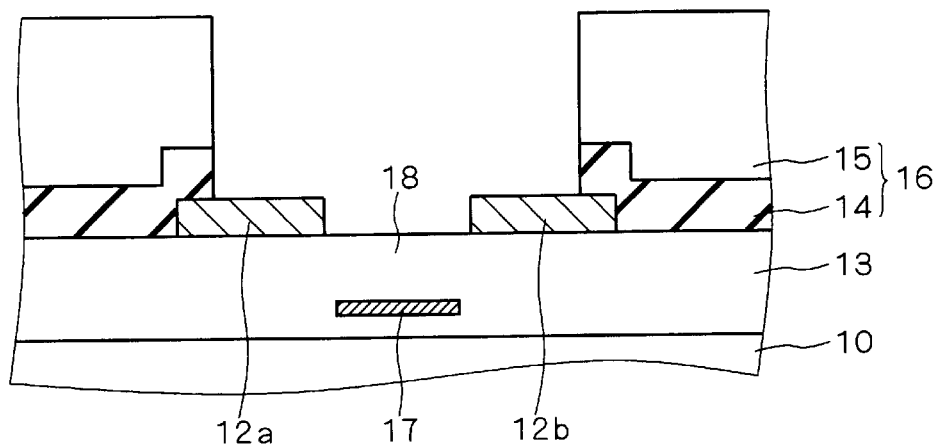
Figure 11:
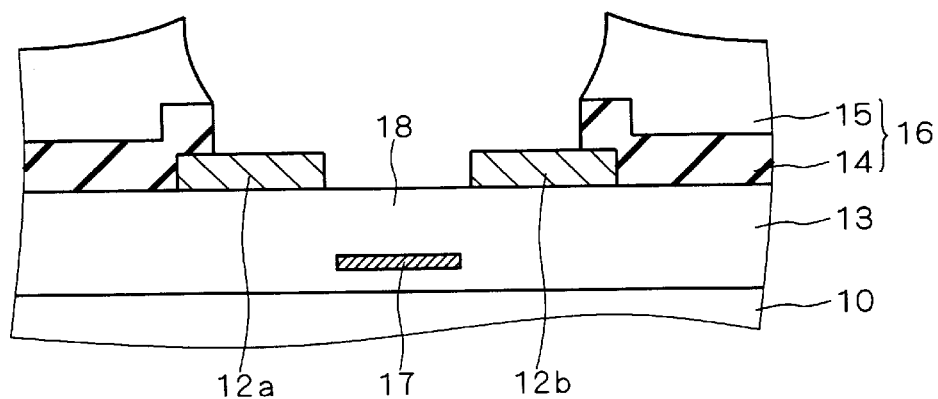

Referring to FIG. 10, isotropic etching is performed on the passivation film 14 using the patterned polyimide film 15 as a mask. As a result of this etching, the passivation film 14 is selectively removed, so that each of the interconnects 12a, 12b and the interlayer insulating film 13 is partially exposed. For the isotropic etching at that time, dry etching is employed. For example, reactive ion etching may be performed. After the passivation film 14 is selectively removed by the isotropic etching, ashing is performed with oxygen plasma. Turning to FIG. 11, then, a heat treatment is carried out at a temperature in the range of approximately 300 to 450° C., to imidize the polyimide film 15. It is noted that the heat treatment is intended to evaporate a solvent used in the polyimide film 15, as well as to imidize the polyimide film 15. Further, in the case where the polyimide film 15 is photosensitive, the heat treatment at that time is also effective in evaporating a photosensitizer in the polyimide film 15.

Figure 12:
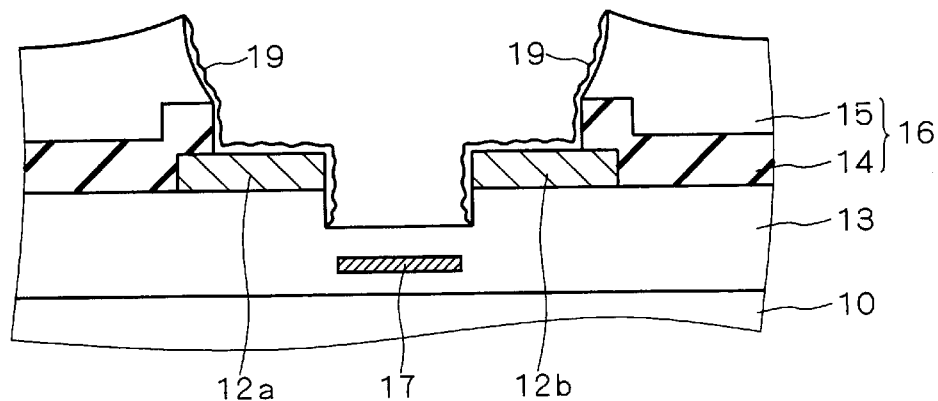
Figure 13:
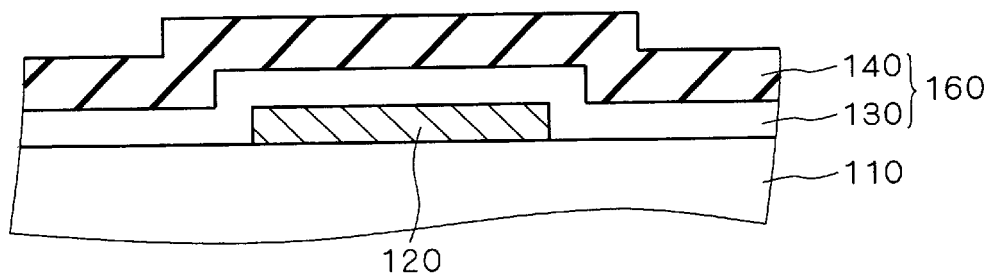
FIGS. 13 through 18 are sectional views of structures at respective steps of a conventional method of manufacturing a semiconductor device.
Figure 14:
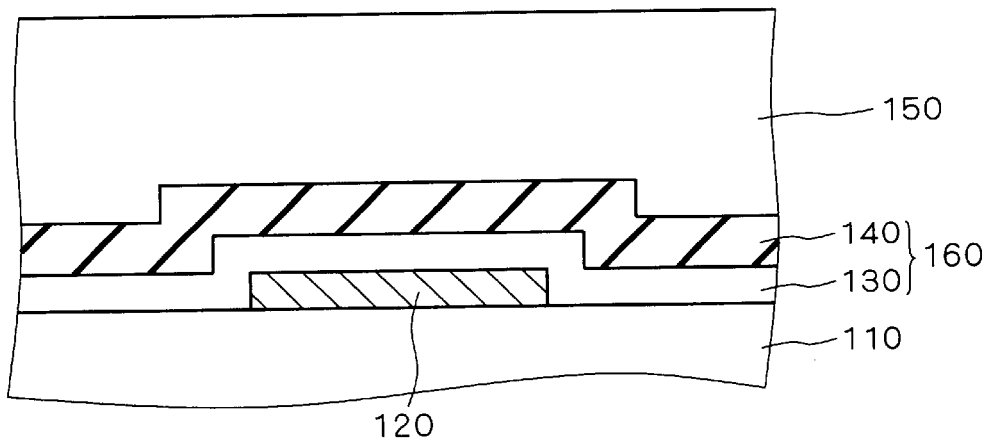
Figure 15:
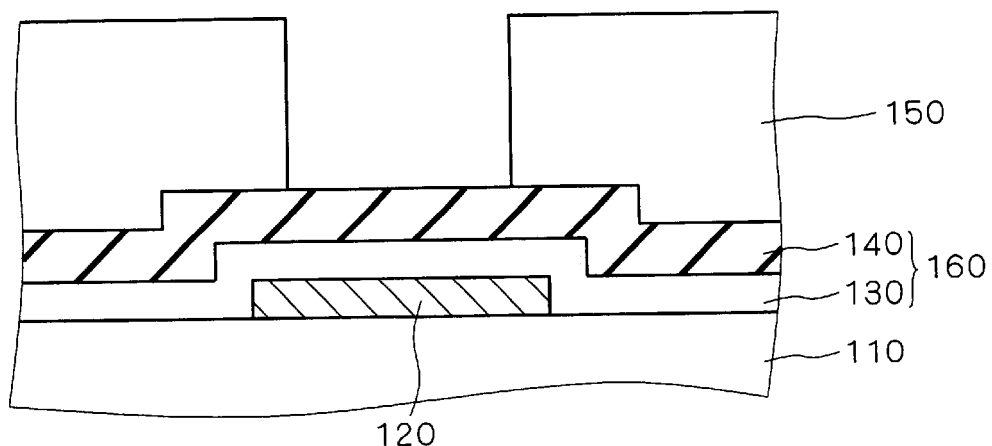
Figure 16:
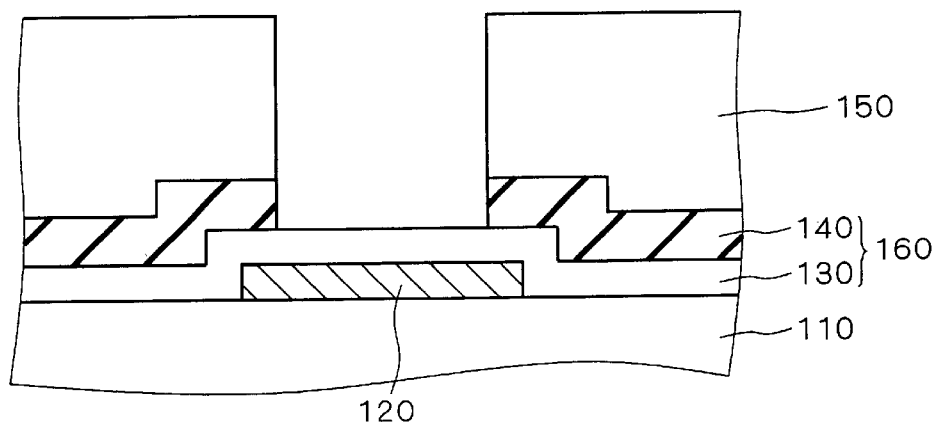
Figure 17:
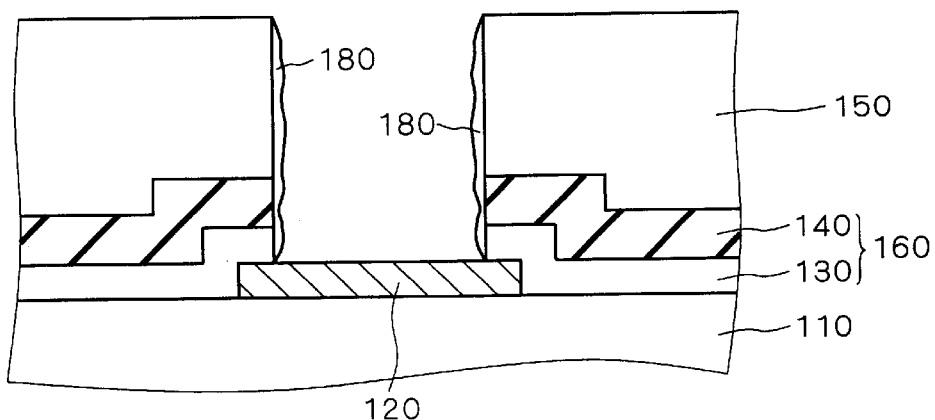
Figure 18:
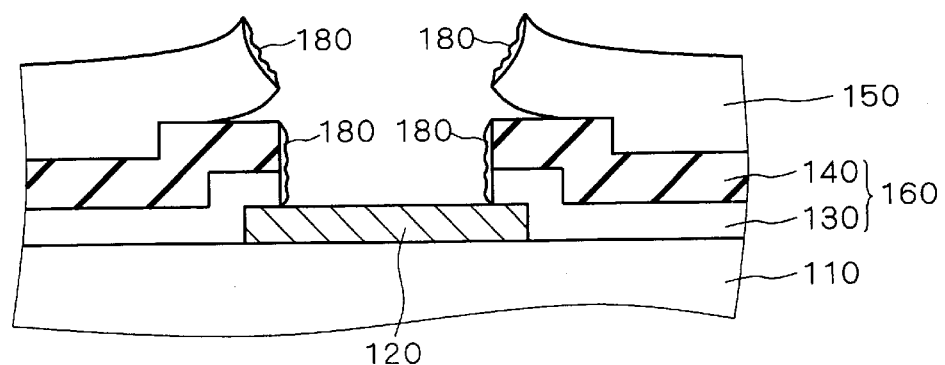

Subsequently, referring to FIG. 12, anisotropic etching is performed on a portion 18 of the interlayer insulating film 13 which has been exposed by the step illustrated in FIG. 10. More specifically, according to the second preferred embodiment, anisotropic etching is performed on the interlayer insulating film 13 using, as a mask, the passivation film 14 and the interconnects 12a, 12b which have undergone the isotropic etching, to adjust the thickness of a portion of the interlayer insulating film 13 located above the fuse 17. For the anisotropic etching at that time, dry etching is employed. For example, reactive ion etching may be performed. Accordingly, deposits 19 are adhered to side faces of the interlayer insulating film 13, the passivation film 14 and the polyimide film 15, as well as to each surface of exposed portions of the interconnects 12a, 12b as illustrated in FIG. 12. After the interlayer insulating film 13 is partially removed by the anisotropic etching, ashing is performed with oxygen plasma, thereby to complete the predetermined pattern in the passivation film 7. While not shown, a wire-bonding process follows, so that each of the exposed portions of the interconnects 12a, 12b and an external terminal (not shown) are connected to each other via an aluminum wire or the like.

A process order of the method of manufacturing a semiconductor device according to the second preferred embodiment as described above includes; first, the isotropic etching on the passivation film 14 illustrated in FIG. 10; next, the heat treatment to imidize the polyimide film 15 illustrated in FIG. 11; and then, the anisotropic etching on the interlayer insulating film 13 illustrated in FIG. 12. In applying the method to a semiconductor device with the passivation film 16 comprising the passivation film 14 and the polyimide film 15, and further includes the interlayer insulating film 13 located under the passivation film 16, the foregoing process order allows the heat treatment for imidizing the polyimide film 15 to be carried out with the deposits 19, which are to be usually generated by anisotropic dry etching, not yet being adhered to the side faces of the passivation film 14 and the polyimide film 15. Thus, not suffering from the above-noted problems associated with the conventional method, the method according to the second preferred embodiment makes it possible to imidize the polyimide film 15 while keeping the polyimide film 15 stuck to the passivation film 14. In other words, it is possible to prevent the polyimide film 15 from coming unstuck from the passivation film 14 to be subjected to the isotropic etching, during the heat treatment for imidizing the polyimide film 15.

The foregoing process order of the method according to the second preferred embodiment produces a further advantage in that the anisotropic etching on the interlayer insulating film 13 is performed after the heat treatment for imidizing the polyimide film 15. Specifically, the deposits 19 are generated and are adhered to the respective side faces of the interlayer insulating film 13, the passivation film 14 and the polyimide film 15 by the anisotropic etching on the interlayer insulating film 13 after the heat treatment for imidizing the polyimide film 5. Hence, advantageously over the conventional method, there is no likelihood that the deposits 19 come off. Thus, it is possible to prevent the deposits 19 which are adhered to the respective side faces of the deposited films by the anisotropic etching from coming off.

Moreover, as the polyimide film 15 is imidized by the heat treatment prior to the etching of the interlayer insulating film 13, the volume shrinkage of the polyimide film 15 occurs and the polyimide film 15 has a sloped side face before the etching of the interlayer insulating film 13. The sloped side face of the polyimide film 15, however, does not adversely affects the etching on the interlayer insulating film 13, because not the polyimide film 15 but the passivation film 14 and the interconnects 12a, 12b are used as a mask in etching the silicon oxide film 3 in the second preferred embodiment. Thus, the method according to the second preferred embodiment is not inferior to the conventional method with respect to the dimensional accuracy of the etched interlayer insulating film 13.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device comprising the steps of:
   (a) forming a polyimide film over a first film with a second film interposed therebetween;
   (b) forming a predetermined pattern in said polyimide film after said step (a);
   (c) performing isotropic etching on said second film using said polyimide film as a mask after said step (b), to expose said first film;
   (d) imidizing said polyimide film by carrying out a heat treatment after said step (c); and
   (e) performing anisotropic etching on an exposed portion of said first film after said step (d).

2. The method according to claim 1, wherein said anisotropic etching is dry etching.

3. The method according to claim 1, wherein said first and second films and said polyimide film form a passivation film.

4. The method according to claim 2, wherein said first and second films and said polyimide film form a passivation film.

5. The method according to claim 1, wherein
   said second film and said polyimide film form a passivation film, and
   said first film functions as an interlayer insulating film.

6. The method according to claim 2, wherein
   said second film and said polyimide film form a passivation film, and
   said first film functions as an interlayer insulating film.

7. The method according to claim 1, wherein
   said first film is a silicon oxide film, and
   said second film is a silicon nitride film.

8. The method according to claim 2, wherein
   said first film is a silicon oxide film, and
   said second film is a silicon nitride film.

9. The method according to claim 2, wherein said dry etching is reactive ion etching.

* * * * *